(12) United States Patent
Mei et al.

(10) Patent No.: US 6,512,625 B2
(45) Date of Patent: *Jan. 28, 2003

(54) LIGHT MODULATION DEVICE AND SYSTEM

(75) Inventors: Wenhui Mei, Plano, TX (US); Kin Foong Chan, Plano, TX (US); Dong Youn Sim, Miyagi-ken (JP)

(73) Assignee: Ball Semiconductor, Inc., Allen, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/728,691

(22) Filed: Dec. 1, 2000

(65) Prior Publication Data

US 2002/0101644 A1 Aug. 1, 2002

Related U.S. Application Data

(63) Continuation-in-part of application No. 09/718,619, filed on Nov. 22, 2000.

(51) Int. Cl.[7] .............................................. G02B 26/00
(52) U.S. Cl. ...................................... 359/290; 359/291
(58) Field of Search ............................... 359/290, 295, 359/292, 291, 224; 313/462

(56) References Cited

U.S. PATENT DOCUMENTS

| | | | |
|---|---|---|---|
| 3,534,467 A | 10/1970 | Sachs et al. ................... 29/583 |
| 4,126,812 A | 11/1978 | Wakefield .................... 313/500 |
| 4,744,047 A | 5/1988 | Okamoto et al. ............ 364/900 |
| 4,786,149 A | 11/1988 | Hoenig et al. ............... 359/290 |
| 4,879,466 A | 11/1989 | Kitaguchi et al. ...... 250/370.14 |
| 5,049,901 A | 9/1991 | Gelbart ........................ 346/108 |
| 5,079,544 A | 1/1992 | DeMond et al. ............. 340/701 |
| 5,082,755 A | 1/1992 | Liu ................................. 430/5 |
| 5,106,455 A | 4/1992 | Jacobsen et al. .......... 156/659.1 |
| 5,109,290 A | 4/1992 | Imai ............................. 359/54 |
| 5,121,983 A | 6/1992 | Lee ................................. 353/8 |

(List continued on next page.)

FOREIGN PATENT DOCUMENTS

| | | | |
|---|---|---|---|
| EP | 0552953 | 7/1993 | ............. G03F/7/20 |
| WO | 9110170 | 7/1991 | ............. G03F/9/00 |

OTHER PUBLICATIONS

"New Multi–EB Direct Write Concept for Maskless High Throughput", Canon SubMicron Focus, vol. 5, Summer 2000.

Sandstrom and Odselius, "Large–Area High Quality Photomasks", Micronic Laser Systems, published by SPIE, vol. 2621, 1985, pp. 312–318.

Singh–Gasson, Sangeet et al., Maskless Fabrication of Light–Directed Oligonucleotide Microarrays Using a Digital Micromirror Array, vol. 17, No. 10, Oct. 1999, pp. 974–978.

Devitt, Terry, "Advanced May Put Gene Chip Technology on Scientists Desktops", http://www.biotech.wise.edu/Education/biotechnews/GeneChip.html, Oct. 7, 1999.

*Primary Examiner*—Ricky Mack
*Assistant Examiner*—Omar Hindi
(74) *Attorney, Agent, or Firm*—Haynes and Boone, LLP

(57) ABSTRACT

A light modulation element, device, and system is discussed. The light modulation element includes three electrodes, a flexible member, and a mirror. The flexible member is connected between the three electrodes so that the first and second electrodes are on one side and the third electrode is on the opposite side of the flexible member. The mirror is attached to the flexible member so that it can move therewith. The flexible member moves responsive to an external electrostatic force provided by one or more of the three electrodes so that the mirror is positioned in a predetermined position responsive to the state of the flexible member.

15 Claims, 12 Drawing Sheets

U.S. PATENT DOCUMENTS

| | | | |
|---|---|---|---|
| 5,131,976 A | 7/1992 | Hoko | 156/630 |
| 5,132,723 A | 7/1992 | Gelbart | 355/40 |
| 5,138,368 A | 8/1992 | Kahn et al. | 355/53 |
| 5,208,818 A | 5/1993 | Gelbart et al. | 372/30 |
| 5,269,882 A | 12/1993 | Jacobsen | 156/659.1 |
| 5,281,996 A | 1/1994 | Bruning et al. | 355/77 |
| 5,300,966 A | 4/1994 | Uehira et al. | 353/30 |
| 5,361,272 A | 11/1994 | Gorelik | 372/50 |
| 5,416,729 A | 5/1995 | Leon et al. | 364/578 |
| 5,431,127 A | 7/1995 | Stevens et al. | 117/75 |
| 5,461,455 A | 10/1995 | Coteus et al. | 355/43 |
| 5,691,541 A | 11/1997 | Ceglio et al. | 250/492.1 |
| 5,771,116 A * | 6/1998 | Miller et al. | 359/295 |
| 5,793,473 A | 8/1998 | Koyama et al. | 355/55 |
| 5,818,498 A | 10/1998 | Richardson et al. | 347/237 |
| 5,850,310 A | 12/1998 | Schweizer | 359/622 |
| 5,870,176 A | 2/1999 | Sweatt et al. | 355/53 |
| 5,892,231 A | 4/1999 | Baylor et al. | 250/398 |
| 5,900,637 A | 5/1999 | Smith | 250/492.22 |
| 5,905,545 A | 5/1999 | Poradish et al. | 348/743 |
| 5,909,658 A | 6/1999 | Clarke et al. | 702/126 |
| 5,936,760 A * | 8/1999 | Choi et al. | 359/298 |
| 5,949,557 A | 9/1999 | Powell | 359/8 |
| 5,955,776 A | 9/1999 | Ishikawa | 257/618 |
| 5,956,005 A * | 9/1999 | Sheridon | 345/84 |
| 5,995,129 A | 11/1999 | Sunagawa et al. | 347/239 |
| 5,995,475 A | 11/1999 | Gelbart | 369/112 |
| 5,998,069 A | 12/1999 | Cutter et al. | 430/5 |
| 6,014,203 A | 1/2000 | Ohkawa | 355/68 |
| 6,048,011 A | 4/2000 | Fruhling et al. | 294/64.3 |
| 6,052,517 A | 4/2000 | Matsunaga et al. | 395/500.09 |
| 6,061,118 A | 5/2000 | Takeda | 355/47 |
| 6,071,315 A | 6/2000 | Ramamurthi et al. | 716/19 |
| 6,072,518 A | 6/2000 | Gelbart | 347/239 |
| 6,084,656 A | 7/2000 | Choi et al. | 355/71 |
| 6,107,011 A | 8/2000 | Gelbart | 430/397 |
| 6,124,876 A | 9/2000 | Sunagawa | 347/239 |
| 6,133,986 A | 10/2000 | Johnson | 355/67 |
| 6,205,364 B1 | 3/2001 | Lichtenstein et al. | 700/58 |
| 6,238,852 B1 | 5/2001 | Klosner | 430/396 |
| 6,251,550 B1 | 6/2001 | Ishikawa | 430/22 |
| 6,252,717 B1 | 6/2001 | Grosskopf | 359/619 |

* cited by examiner

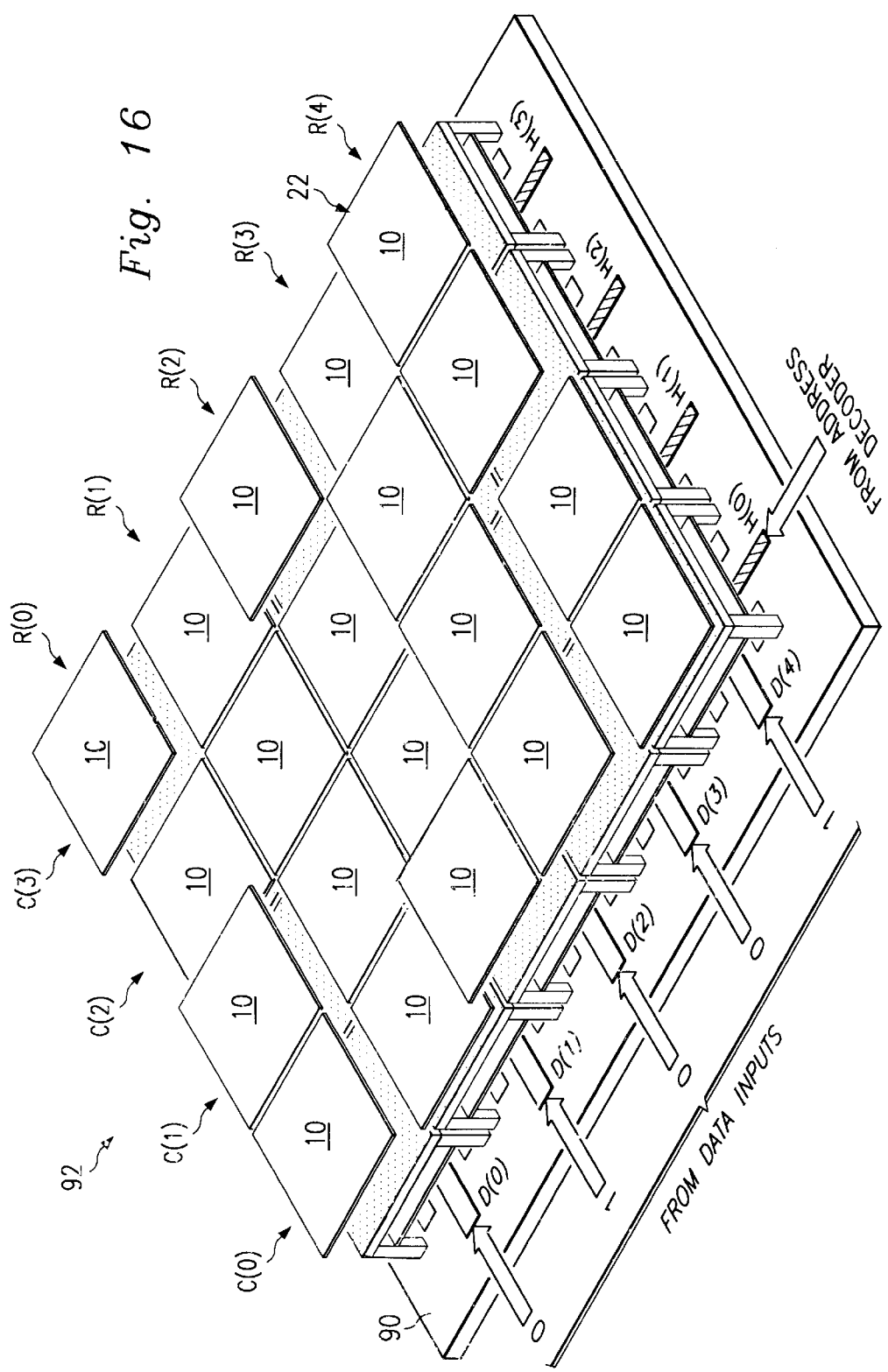

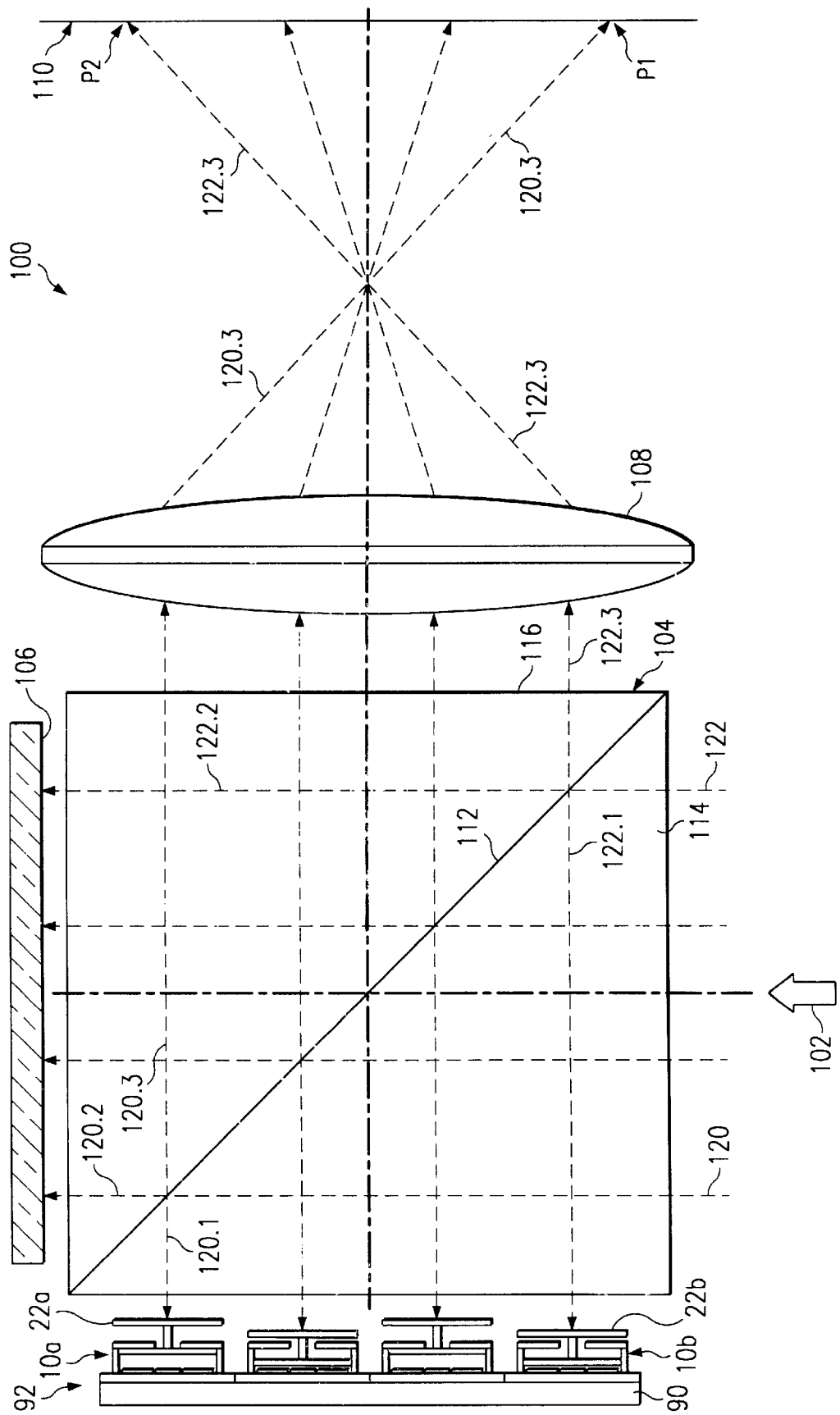

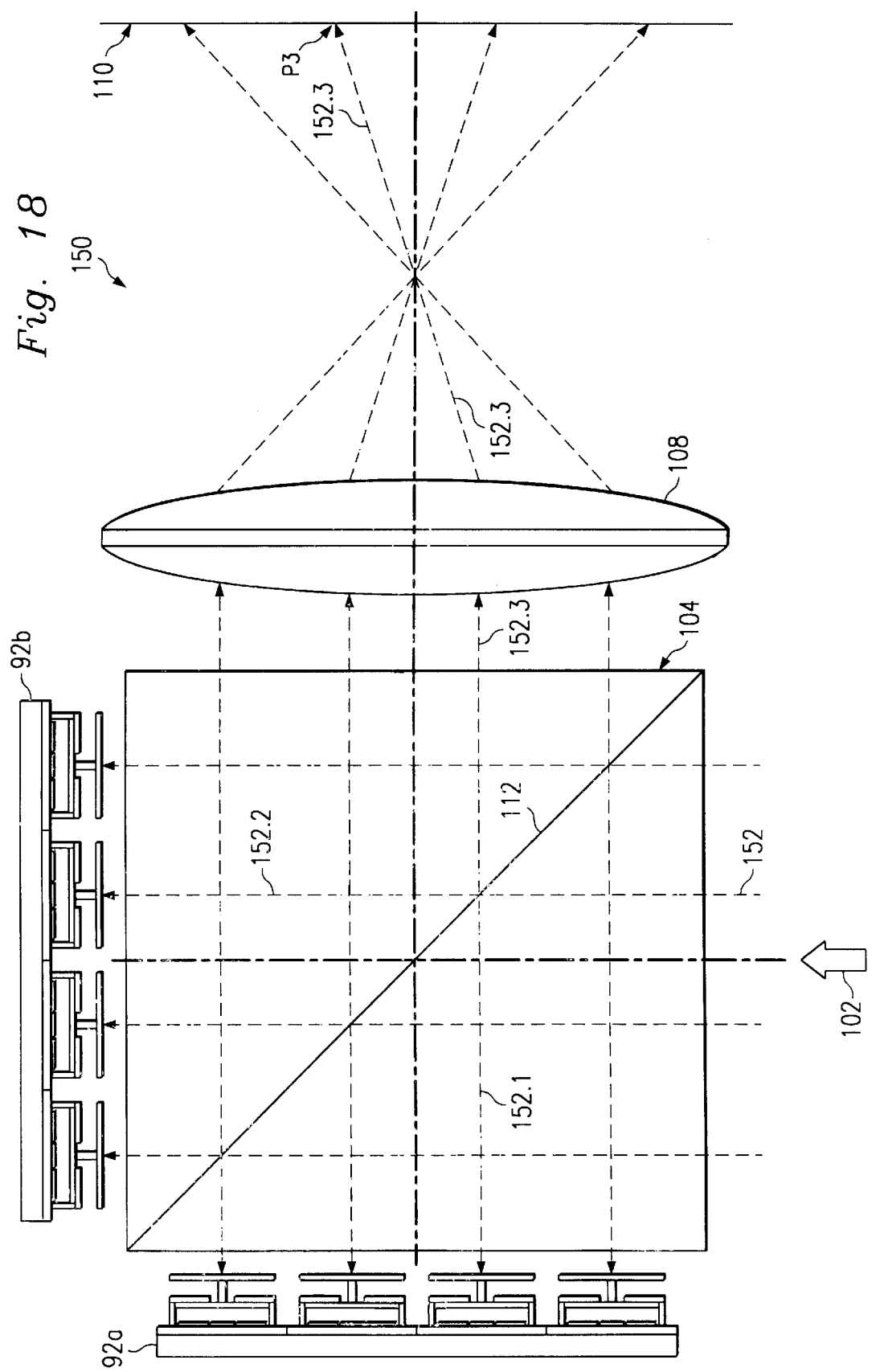

LIGHT MODULATION DEVICE AND SYSTEM

CROSS REFERENCE

The present disclosure is a continuation-in-part of U.S. patent application Ser. No. 09/718,619, entitled Light Modulation Device and System, filed on Nov. 22, 2000.

BACKGROUND

The present invention relates generally to optical devices and optical systems, and more particularly to a device for modulating a light beam intensity and a projector/exposure system using such a device.

Devices which modulate an aspect of a light beam, e.g. an amplitude or phase of the light, find a number of applications. In optical modulation applications, phase modulation is often more important than amplitude modulation. Furthermore, phase modulation devices can often perform amplitude modulation, thereby providing application flexibility. It is desired to provide a light modulation device that is fast, reliable, durable, efficient, and can be used in simple as well as complex applications.

SUMMARY

A technical advance is provided by a new and unique light element. In one embodiment, the light element includes three electrodes, a support structure, a flexible member, and a mirror. The flexible member is connected to the support structure so that it is responsive to electrostatic forces provided by one or more of the three electrodes. The flexible member is positioned in a gap so that it can move between a first and second state, responsive to the electrostatic forces. The mirror is also attached to the flexible member, so that it too moves between a first and second state.

In another embodiment, the light element includes first, second, and third electrodes positioned adjacent to a substrate, each electrode capable of producing a force. Two support members are also connected to the substrate and a flexible member spans there between, extending over and above the three electrodes and capable of moving between a first and second state. As in the previous embodiment, a mirror is connected to and extends above the flexible member.

In another embodiment, the light element includes a first, second, and third electrode for producing a first, second and third force, respectively. A flexible member, which is responsive to a force, is connected to a support structure. A mirror is further attached to the flexible member. In operation, the flexible member, and hence the mirror, transition between different states responsive to various combinations of the first, second, and third forces.

In yet another embodiment, the light element includes two electrodes connected to the substrate for producing an electrostatic force and a flexible member suspended over the two electrodes. An actuator and a third electrode are also included, the actuator being adjacent the flexible member. The first two electrodes are situated to hold the flexible member in a prior state responsive to a hold voltage applied thereto, and the actuator is situated to selectively move the flexible member between two operational states.

BRIEF DESCRIPTION OF THE DRAWINGS

FIGS. 12–16 are isometric views of one embodiment of several light modulation elements that are part of a single micro-mirror light modulating device, according to the present invention.

FIGS. 17–18 are cross sectional views of different embodiments of a projection system, utilizing one or more of the light modulation devices discussed in FIGS. 12–16.

DETAILED DESCRIPTION

The present disclosure relates to optical devices and optical systems, such as can be used in a wide variety of applications. It is understood, however, that the following disclosure provides many different embodiments, or examples, for implementing different features of the invention in specific applications. These embodiments are, of course, merely examples and are not intended to limit the invention from that described in the claims.

The present disclosure is divided into four different sections. The first section describes an element for light phase modulation. The second section describes a light phase modulation device including several of the elements. The third section describes different applications for the light phase modulation device. The fourth section concludes by describing some of the many advantages of the element, device, and applications previously discussed.

Light Phase Modulation Element

Figure 1:
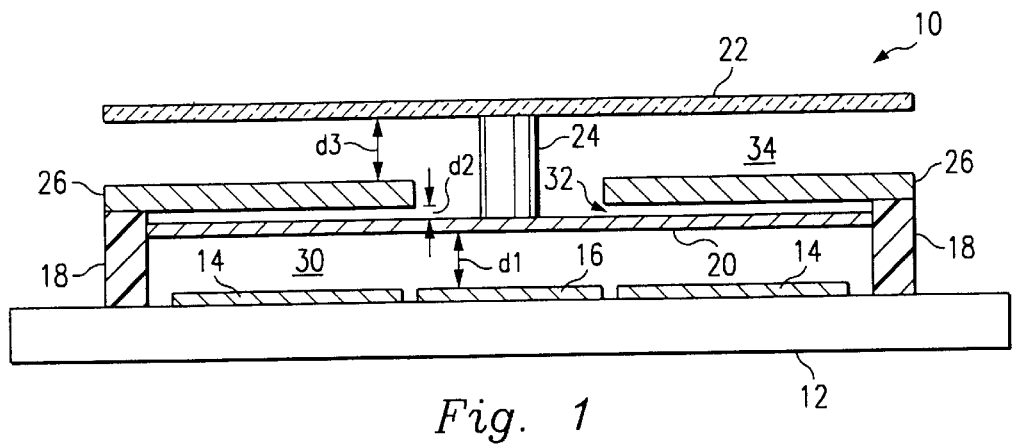
FIGS. 1, 4, and 9 are side, cross sectional views of several different embodiments of light modulating elements according to the present invention.

Referring to FIG. 1, a component layout for one embodiment of a light modulation element 10 is shown. In the present embodiment, the light modulation element 10 is constructed on a semiconductor substrate 12. Two electrodes 14, 16 are formed adjacent to the substrate 12. Each electrode is, in the present embodiment, a solid film of electrically conductive material, such as metal. The electrodes 14, 16 are positioned between non-conductive support structures 18. The support structures 18 secure a flexible, spring-like member 20, which is also responsive to electrostatic fields. The flexible member 20 is further connected to a mirror 22 through a connecting portion 24. The mirror may be of many different types of reflective materials, such as gold, aluminum, copper, or a combination thereof, depending on the use (e.g., infrared, x-ray) for the light modulation element 10. The support structures 18 also secure a third electrode 26.

The light modulation element 10 is a micro-electro-mechanical (MEM) device, and therefore has several gap areas to allow mechanical movement. A first area 30 is defined between the electrodes 14, 16 and the flexible member 20. A second area 32 is defined between the flexible member 20 and the third electrode 26. A third area 34 is defined between the third electrode 26 and the mirror 22. There are many different processing methods to construct the various gap areas 30, 32, 34. For example, a sacrificial layer can be fabricated into the areas, and then later removed by an appropriate vapor etch.

As shown in FIG. 1, a distance d1 is provided between the flexible member 20 and the second electrode 16; a distance d2 is provided between the flexible member 20 and the third electrode 26; and a distance d3 is provided between the third electrode 26 and the mirror 22. Although the distances d1, d2, d3 can vary, depending on different materials used (e.g., for the flexible member 20) or other factors, in the present embodiment, the distances are defined by equations (1) and (2), below.

$$d1, d3 >> d2. \quad (1)$$

$$d3 \sim d1 \quad (2)$$

As will be discussed in greater detail below, in some applications, the distances d1, d2, d3 will be related to a wavelength $\lambda$ of light being reflected off of the mirror 22. For the sake of example, a light source may have a wavelength $\lambda$ of 400 nano-meters (nm). In this example, the distances d1, d3 could be equal to 100 nm and the distance d2 could be about 5–10 nm.

Figure 2:
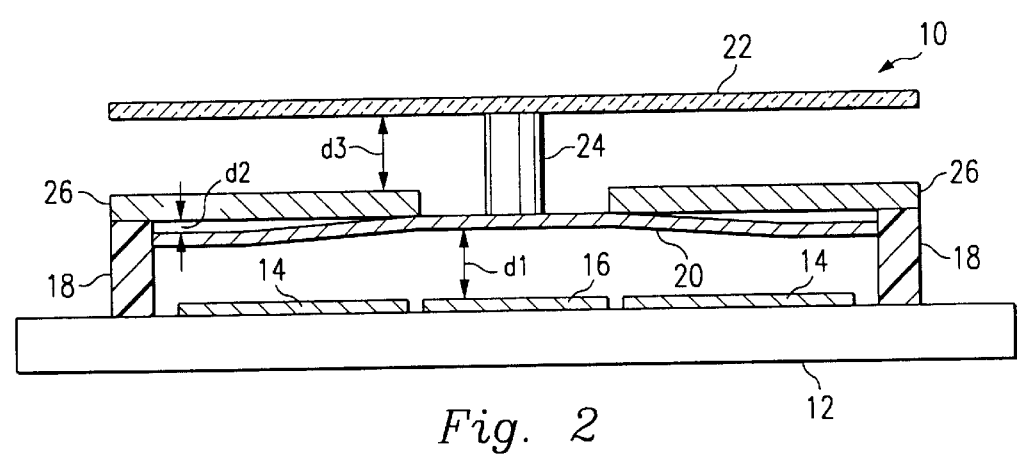
FIGS. 2–3 illustrate different states of the light modulating element of FIG. 1.
Figure 3:
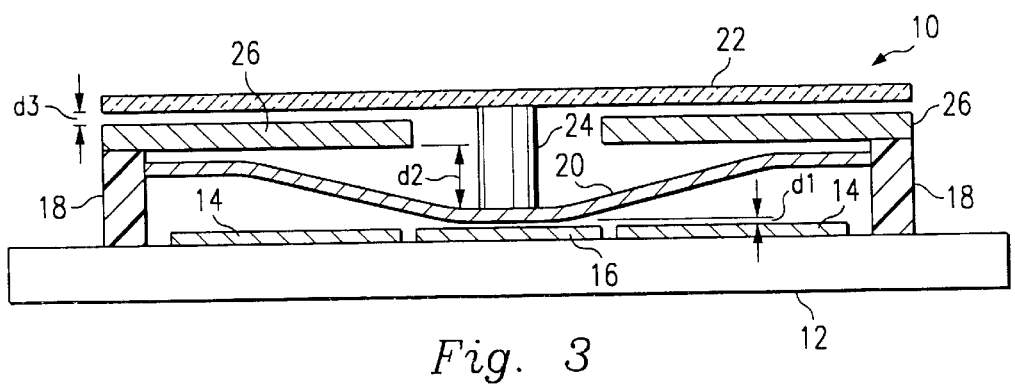

Referring also to FIGS. 2 and 3, the light modulation element 10 can be in three different mechanical states. FIG. 1 illustrates a "free" state in which the flexible member 20 is in a natural, un-flexed state. As shown in FIG. 1, the distance d2 is relatively small, and the distances d1, d3 are relatively large.

FIG. 2 illustrates an "upper" state in which the flexible member 20 is flexed upward, as seen in the figure, and away from the substrate 12. As shown in FIG. 2, the distance d2 is approximately equal to zero and the distances d1, d3 are larger than they were in the free state. In many applications, the difference between the upper and free states can be considered as insignificant.

FIG. 3 illustrates a "lower" state in which the flexible member 20 is flexed downward, as seen in the figure, and toward the substrate 12. As shown in FIG. 3, in the upper state, the distances d1, d3 are approximately equal to zero and the distance d2 is now relatively large.

The three states—free, upper, and lower—are defined by electrostatic forces applied between the three electrodes 14, 16, 26 and/or the flexible member 20. In the present embodiment, the flexible member 20 is at a first voltage and the electrodes 14, 16, 26 can selectively alternate between the first voltage and a second voltage. For the sake of reference, the first voltage will be ground, designated with a binary "0", and the second voltage will represent a positive voltage, designated with a binary "1". Furthermore, in the present example, the positive voltage 1 will electrostatically attract an item at the ground voltage 0. It is understood, however, that various combinations of different voltages can produce different operations, so that the present invention can facilitate many different design choices well understood by those of ordinary skill in the art.

The light modulation element 10 can also be in a "hold" state. The hold state maintains a prior state of the element 10, despite changes in electrode voltage. Simply put, the hold state serves as a memory for the element 10. The hold state will be discussed in greater detail, below.

The light modulation element 10 can operate in many different configurations of the electrodes 14, 16, 26. Referring now to Table 1, in one configuration, each of the electrodes 14, 16, 26 can operate independently of the others.

TABLE 1

| Electrode 14 | Electrode 16 | Electrode 26 | State |
|---|---|---|---|
| 0 | 0 | 0 | free |
| 0 | 0 | 1 | upper |
| 0 | 1 | 0 | lower |
| 0 | 1 | 1 | hold |
| 1 | 0 | 0 | lower |
| 1 | 0 | 1 | hold |
| 1 | 1 | 0 | lower |
| 1 | 1 | 1 | hold |

Referring to FIGS. 1–3, consider for example that electrodes 14 and 16 are 1 and that the light modulation element 10 is currently in the lower state, meaning that the distance d3 is small, and the mirror 22 is in the lower position. Next, electrode 26 switches to 1. According to Table 1, the light modulation element 10 will be in the hold state. In the present example, the hold state will "hold" the previous state, so that the mirror 22 stays in the lower state. Next, electrode 26 switches to 0. According to Table 1, the light modulation element 10 will still be in the hold state. This means that the previous lower state continues to be held. Therefore, as long as the electrodes 14 and 26 stay at 1, the lower state will be held. Many different scenarios can be shown to hold the free state or the upper state.

The light modulation element 10 is able to hold a certain state by controlling the strength of the electrostatic fields produced from the electrodes 14, 16 and/or 26. In the present embodiment, the strength of the electrostatic fields that are affecting the flexible member 20 are manipulated by the distances d1, d2, and/or d3. In other embodiments, the strength of the fields can be manipulated in many different ways. For example, the strength of the corresponding electrostatic fields can be manipulated by the size of the electrodes 14, 16, and/or 26, the material used to construct each electrode, the voltage applied to each electrode, and/or any intervening structures.

Referring now to Table 2, electrode 16 can also be used as an edge-trigger input. For example, if electrode 14 is 0 and electrodes 16 and 26 are 1, the light modulation element 10 will be in the hold state. However, if electrode 16 switches to 0, the light modulation element 10 will switch to the upper state. If electrode 16 switches back to 1, the light modulation element 10 will be held in the upper state. Therefore, after every change of electrode 16, the light modulation element will be in the upper state. This works in a similar manner for the lower state and the hold state.

TABLE 2

| Electrode 14 | Electrode 16 | Electrode 26 | State |
|---|---|---|---|
| 0 | Change | 1 | upper |
| 1 | Change | 0 | lower |
| 1 | Change | 1 | hold |
| 0 | 1 | 0 | lower |
| 0 | 0 | 0 | free |

Referring now to Table 3, in another configuration, electrodes 14 and 26 are tied together, and electrode 16 can operate independently of the other two. As can be seen by the last two rows of Table 3, when electrodes 14 and 26 both have the 1 voltage, the light modulation element 10 is in the hold state, regardless of the voltage for electrode 16. Therefore, the electrodes 14, 26 are treated together as a "hold electrode", placing the light modulation element 10 in and out of the hold state. When the light modulation element is not in the hold state, the electrode 16 acts as a "data electrode", with the free state corresponding to a 0 value and the lower state corresponding to a 1 value.

TABLE 3

| Electrodes 14, 26 | Electrode 16 | State |
|---|---|---|
| 0 | 0 | free |
| 0 | 1 | lower |
| 1 | 0 | hold |
| 1 | 1 | hold |

Figure 4:
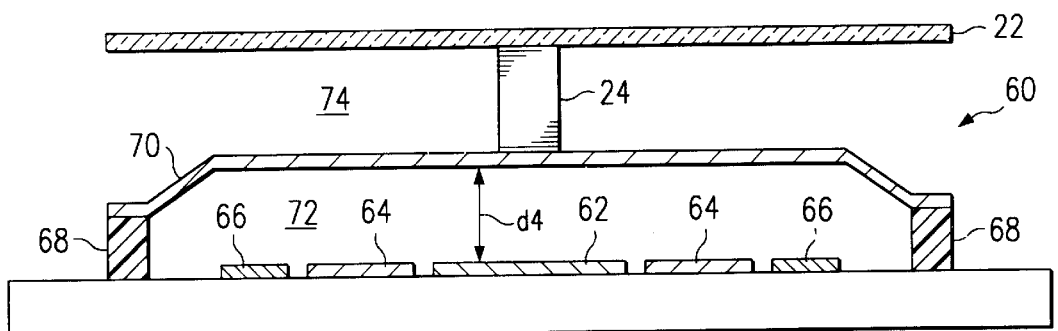

Referring now to FIG. 4, a component layout for another embodiment of a light modulation element 60 is shown. Components of the element 60 that can be similar to those of the element 10 (FIG. 1) are commonly numbered. In the present embodiment, the light modulation element 60 is constructed on a semiconductor substrate 12. Three electrodes 62, 64, 66 are formed adjacent to the substrate 12, although different embodiments may include an insulative material (not shown) to facilitate electrical isolation. Each electrode is, in the present embodiment, a solid film of electrically conductive material, such as metal. The electrodes 62–66 are positioned between non-conductive support structures 68. The support structures 68 secure a flexible spring-like member 70. The flexible member 70 is non-linear, which means that it has a tendency to "pop" into either of two states, as will be discussed in greater detail, below. The flexible member 70 is further connected to a mirror 22 through a connecting portion 24. The mirror may be of many different types of reflective materials, such as gold, aluminum, copper, or a combination thereof, depending on the use (e.g., infrared, x-ray) for the light modulation element 60.

The light modulation element 60 is also a MEM device, and therefore also has several gap areas to allow mechanical movement. A first area 72 is defined between the three electrodes 62–66 and the flexible member 70. A second area 74 is defined between the flexible member 70 and the mirror 22.

As shown in FIG. 4, a distance d4 is provided between the flexible member 70 and the electrodes 62–66. For the sake of example, the distance d4 can be considered similar to the distance d1 of FIG. 1.

The light modulation element 60 can be in two different mechanical states. FIG. 4 illustrates a free state in which the flexible member 70 is in a natural, un-flexed state. As shown in FIG. 4, the distance d4 is relatively large. In the present embodiment, the free state is also considered the upper state.

Figure 5:
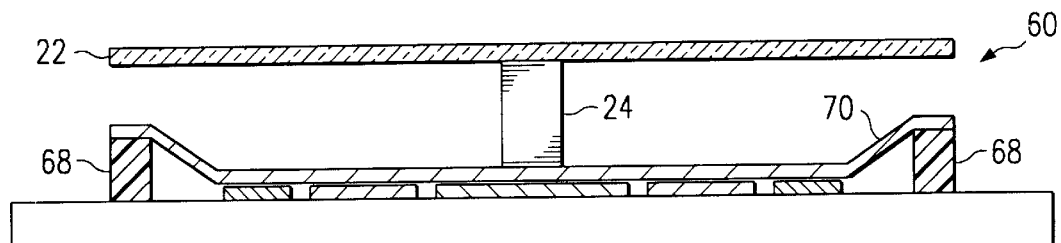
FIG. 5 illustrates another state of the light modulating element of FIG. 4.

FIG. 5 illustrates a lower state in which the flexible member 70 is flexed downward, as seen in the figure, and towards the substrate 12. As shown in FIG. 5, the distance d4 is approximately equal to zero.

Figure 6:
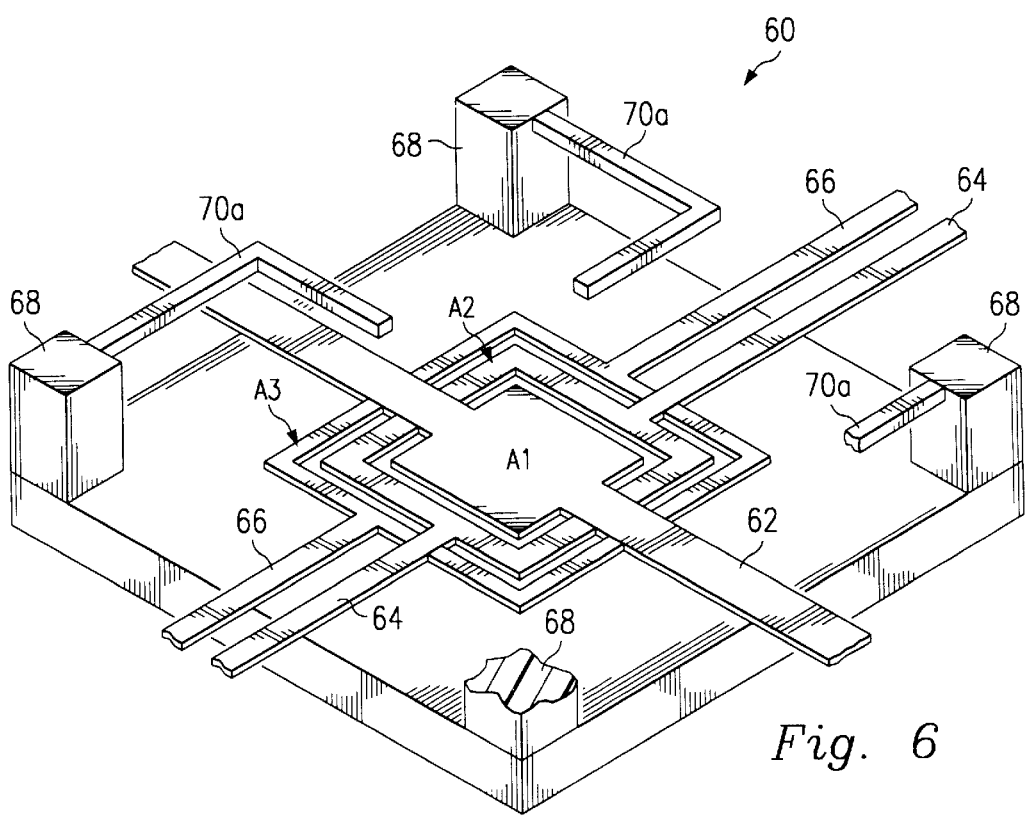
FIGS. 6–7 are exploded views of the light modulating element of FIG. 4.
Figure 7:
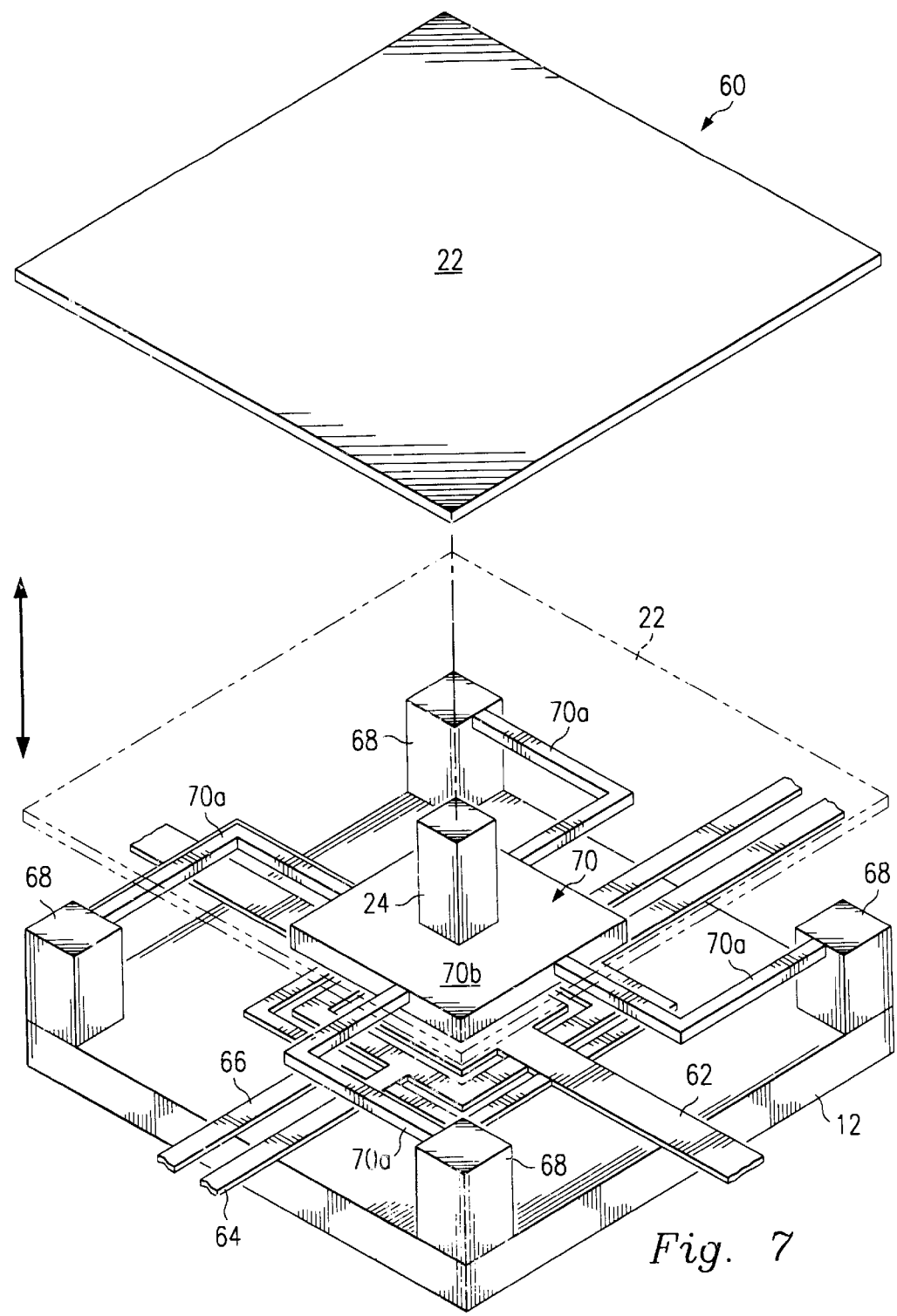

Referring also to FIGS. 6 and 7, the flexible member 70 includes two different sub-components. A plurality of flexible legs 70a are provided, each connected to one of the support structures 68. The flexible legs 70a meet at a central portion 70b, which is further connected to the mirror 22 through the connecting portion 24. The central portion 70b is made of a material that is responsive to electrostatic fields caused by one or more of the electrodes 62–66. In the present embodiment, the flexible legs 70a and the central portion 70b are configured to provide a non-linear flexing action (the "pop"). As a result, the flexible member 70, and hence the mirror 22, pops between two states, as illustrated by the arrow 72. It is understood that there are many configurations of the flexible legs 70a, central portion 70b and/or support structures 68 that will support a non-linear flexing action.

Referring specifically to FIG. 6, the first electrode 62 has an area A1 under the central portion 70b, the second electrode 64 has an area A2 under the central portion, and the third electrode 66 has an area A3 under the central portion. In the present embodiment, the areas are such that:

$$A1=A2=A3. \quad (3)$$

By selecting the areas A1, A2, A3, the amount of electrostatic force produced by each electrode 62–66 can be controlled. In other embodiments, the electrostatic force can be controlled by other means, such as voltage level or material composition of each electrode. Also in other embodiments, it may be desirable to have different electrostatic forces associated with each electrode.

Figure 8:
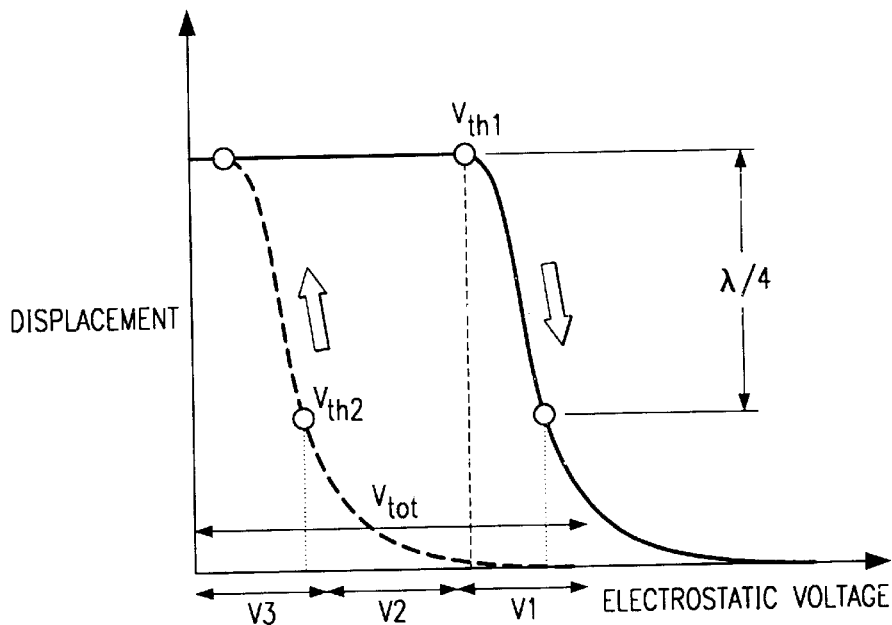
FIG. 8 is a graph illustrating the operation of the light modulating element of FIG. 4.

Referring to FIG. 8, a graph 76 illustrates the operation of the light modulation element 60. A vertical axis, labeled "Displacement", shows a position for the central portion 70b of the flexible member 70, and thus the position of the mirror 22. A horizontal axis, labeled "Electrostatic Voltage", shows a value for the voltages of the three electrodes 62–66. The graph 76 includes two curves 78d, 78u. The curve 78d represents a downward motion for the flexible member 70, and the curve 78u represents an upward motion for the flexible member. As a result, the curves 78u, 78d illustrate an operational hysteresis for the flexible member 70. In some embodiments, the lower state of the flexible member 70 may be controlled by a mechanical stopper, such as is discussed in greater detail with respect to FIG. 10, below.

Consider for example that the electrodes 62, 64, 66 are capable of providing a voltage V1, V2, V3, respectively. In this example, the first electrode 62 (with the voltage V1) serves as a data electrode, the second electrode 64 (with the voltage V2) serves as an "active electrode," and the third electrode 66 (with the voltage V3) serves as a "lock/reset electrode." A value $V_{TH1}$ is a threshold voltage where there is sufficient electrostatic force to pop the flexible member 70 from the upper state (FIG. 4) to the lower state (FIG. 5). A value $V_{TH2}$ is a threshold voltage where there is sufficient electrostatic force to release (or "unpop") the flexible member 70 from the lower state back to the upper state. In the present embodiment, the voltages V1, V2, $V_{TH1}$, $V_{TH2}$, and a total voltage $V_{TOT}$ are defined by the following relationships:

$$V_{TOT}=V1+V2+V3 \quad (4)$$

$$V_{TH1}>(V3+V2) \quad (5)$$

$$V_{TH1}>(V3+V1) \quad (6)$$

$$V_{TH2}<V3 \quad (7)$$

$$V2 \sim V1. \quad (8)$$

The light modulation element 60 can operate in many different configurations of the electrodes 62–66. Referring now to Table 4, in one configuration, each of the electrodes 62–66 can operate independently of the others. Table 4 utilizes the 0/1 voltage designations discussed above, with the 0 voltage designation representing zero volts, and the 1 voltage designation representing either V1, V2, or V3, as identified above.

TABLE 4

| Electrode 62 (V1) | Electrode 64 (V2) | Electrode 66 (V3) | State | Operation |
|---|---|---|---|---|
| 0 | 0 | 0 | free | reset |
| 0 | 0 | 1 | prior state | lock prior state |
| 0 | 1 | 0 | n/a | n/a |
| 0 | 1 | 1 | free | active |
| 1 | 0 | 0 | n/a | n/a |
| 1 | 0 | 1 | prior state | lock prior state |
| 1 | 1 | 0 | n/a | n/a |
| 1 | 1 | 1 | down | active |

Note: Some voltage combinations are not used in the present embodiment, and are therefore designated "n/a."

The operation of Table 4 supports two distinct operations: writing a data value from the first electrode 62, and holding the data value previously written. To write to the element 60, the element is first reset by setting all three electrodes 62–66 to zero. When the element 60 resets, it is in the free or upper state. Then, the third electrode 66 is set to 1 (thereby locking the element) and the second electrode 64 is set to 1 (thereby activating the element). At this time, the element 60 will be responsive to the data (0 or 1) from the first electrode 62.

To hold the data value previously written (so that the element 60 is no longer responsive to the data in the first electrode), the third electrode 66 is set to 1 and the second electrode 64 is set to 0. At this time, the element 60 will not be responsive to the data in the first electrode 62, and the state of the element will remain unchanged.

Therefore, the third electrode 66 remains locked (set to 1) at all times, except when the element 60 is being reset. The second electrode 64 is active (set to 1) when it is desired that the element 60 be responsive to data from the first electrode 62, and inactive (set to 0) when it is desired that the element not be responsive to data from the first electrode.

Figure 9:
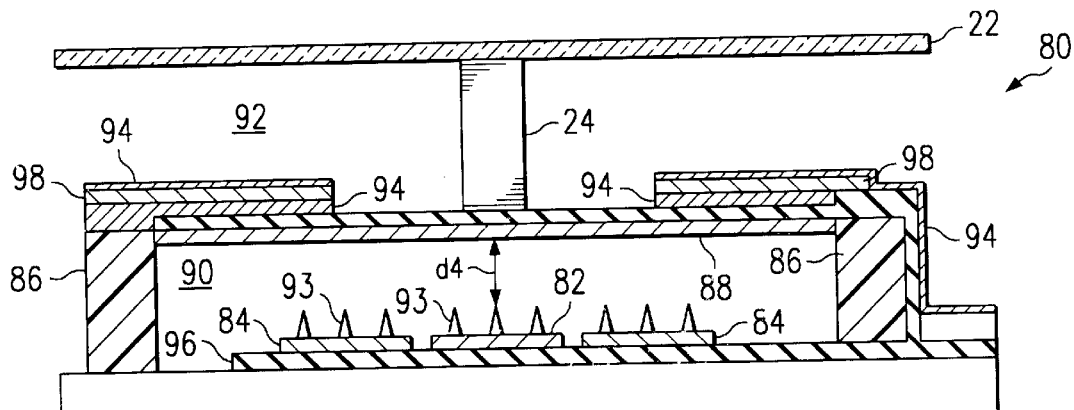

Referring now to FIG. 9, a component layout for yet another embodiment of a light modulation element 80 is shown. Components of the element 80 that can be similar to those of the elements 10 (FIG. 1) and 60 (FIG. 4) are commonly numbered. In the present embodiment, the light modulation element 80 is constructed on a semiconductor substrate 12. Two electrodes 82, 84 are formed adjacent to the substrate 12. Each electrode 82, 84 is, in the present embodiment, a solid film of electrically conductive material, such as metal. The electrodes 82-84 are positioned between non-conductive support structures 86. The support structures 86 secure a flexible member 88. The flexible member 88 is further connected to a mirror 22 through a connecting portion 24.

The light modulation element 80 is also a MEM device, and therefore also has several gap areas to allow mechanical movement. A first area 90 is defined between the two electrodes 82–84 and the flexible member 88. A second area 92 is defined between the flexible member 88 and the mirror 22. As in the element 60 of FIG. 4, a distance d4 is provided between the flexible member 88 and the electrodes 82–84. In some embodiments, nonconductive stopper devices 93 may be attached to the electrodes 82–84. The stopper devices 93 serve to limit the movement of the flexible member 88 and to prevent contact between the electrode 82 and the flexible member.

A third electrode 94 extends above the flexible member 88. Unlike the element 100 of FIG. 1, the third electrode 94 is separated from the flexible member 88 by an isolation layer 96. The isolation layer 96 may serve as an electrical isolator and/or a thermal isolator, as needed. In some embodiments, the isolation layer 96 is used throughout the element 80.

Figure 10:
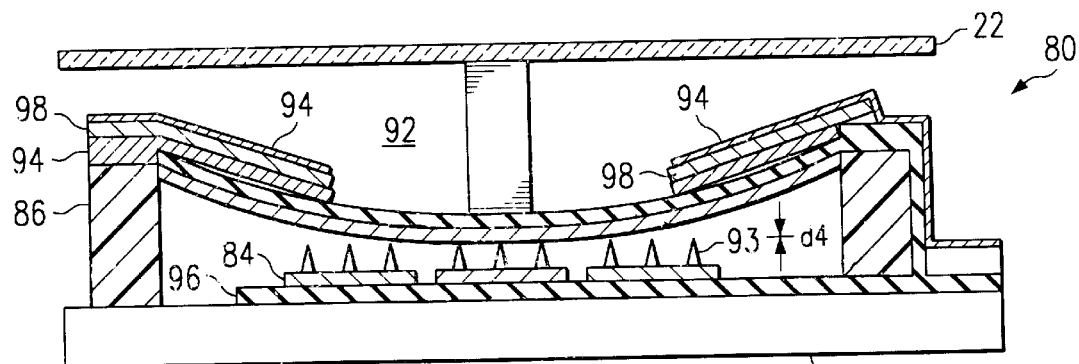
FIG. 10 illustrates another state of the light modulating element of FIG. 9.

Referring to FIGS. 9 and 10, an actuator 98 is positioned adjacent to the flexible member 88 and adjacent to the third electrode 94. The actuator 98 is capable of placing the light modulation element 80 in two different states: free and lower. FIG. 9 illustrates the free state in which the flexible member 88 is in a natural, un-flexed state. As shown in FIG. 9, the distance d4 is relatively large. In the present embodiment, the free state is also considered the upper state. FIG. 10 illustrates the lower state in which the flexible member 88 is flexed downward, as seen in the figure, and towards the substrate 12. As shown in FIG. 10, the distance d4 is approximately equal to zero.

The actuator 98 is triggered by the third electrode 94. In one embodiment, the actuator 98 is a PZT thin film micro-actuator. The PZT actuator 98 utilizes piezoelectric effects to move the flexible member 88 to the lower state. In another embodiment, the actuator 98 is a thermal type, or "pyroelectric" actuator. The pyroelectric actuator 98 utilizes the thermal expansion of thin films to move the flexible member 88 to the lower state. Therefore, in response to a voltage/current signal on the third electrode 94, the actuator 98 (piezoelectric or pyroelectric) fluctuates between the two states illustrated in FIGS. 9 and 10.

Figure 11:
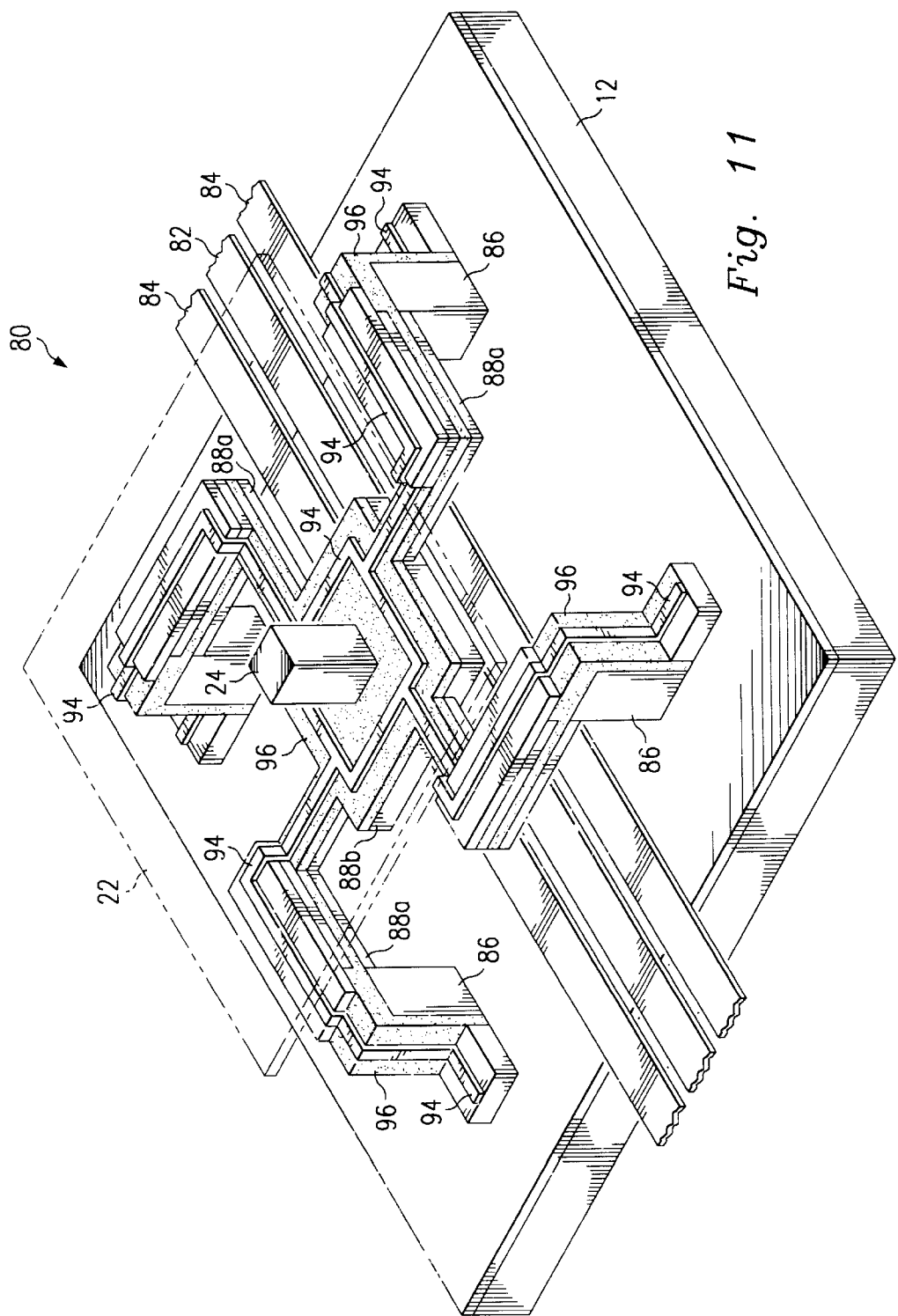
FIG. 11 is an exploded view of the light modulating element of FIG. 9.

Referring also to FIG. 11, the flexible member 88 includes two different sub-components. A plurality of flexible legs 88a are provided, each connected to one of the support structures 68. The flexible legs 88a meet at a central portion 88b, which is further connected to the mirror 22 through the connecting portion 24. Each flexible leg 88a includes the isolation layer 96, the actuator 98, and the third electrode 94. The central portion 88b is made of a material that is responsive to electrostatic fields caused by one or more of the electrodes 82–84. In the present embodiment, the flexible legs 88a move responsive to the actuator 98, and thereby move the central portion 88b between the upper (free) and lower states. It is understood that there are many configurations of the flexible legs 88a, central portion 88b and/or support structures 86 that will support the above-described action.

The light modulation element 80 can operate in many different configurations of the electrodes 82, 84, 94. Referring now to Table 5, in one configuration, each of the electrodes 82, 84, 94 can operate independently of the others.

TABLE 5

| Electrode 94 | Electrode 84 | Electrode 82 | State |
|---|---|---|---|
| 0 | 0 | 0 | free |
| 0 | 0 | 1 | upper |
| 0 | 1 | 0 | lower |
| 0 | 1 | 1 | hold |
| 1 | 0 | 0 | lower |
| 1 | 0 | 1 | hold |
| 1 | 1 | 0 | lower |
| 1 | 1 | 1 | hold |

In this configuration, the element 80 operates similarly to the element 10 discussed with reference to Table 1. It is noted, however, that the upper state and the free state are the same for the element 80.

Referring now to Table 6, in another configuration, electrodes 82 and 94 are tied together, and electrode 84 can operate independently of the other two. As can be seen by the last two rows of Table 6, when electrodes 82 and 94 both have the 1 voltage, the light modulation element 80 is in the hold state, regardless of the voltage for electrode 84. Therefore, the electrodes 82, 94 are treated together as a hold electrode, placing the light modulation element 80 in and out of the hold state. When the light modulation element is not in the hold state, the electrode 84 acts as a data electrode, with the free state corresponding to a 0 value and the lower state ending to a 1 value.

TABLE 6

| Electrodes 14, 26 | Electrode 84 | State |
|---|---|---|
| 0 | 0 | free |
| 0 | 1 | lower |
| 1 | 0 | bold |
| 1 | 1 | hold |

Therefore, the light modulation elements 10, 60 and 80 can perform in many different ways, and can be combined to accommodate different applications, some of which are discussed below.

Light Phase Modulation Device

Figure 12:
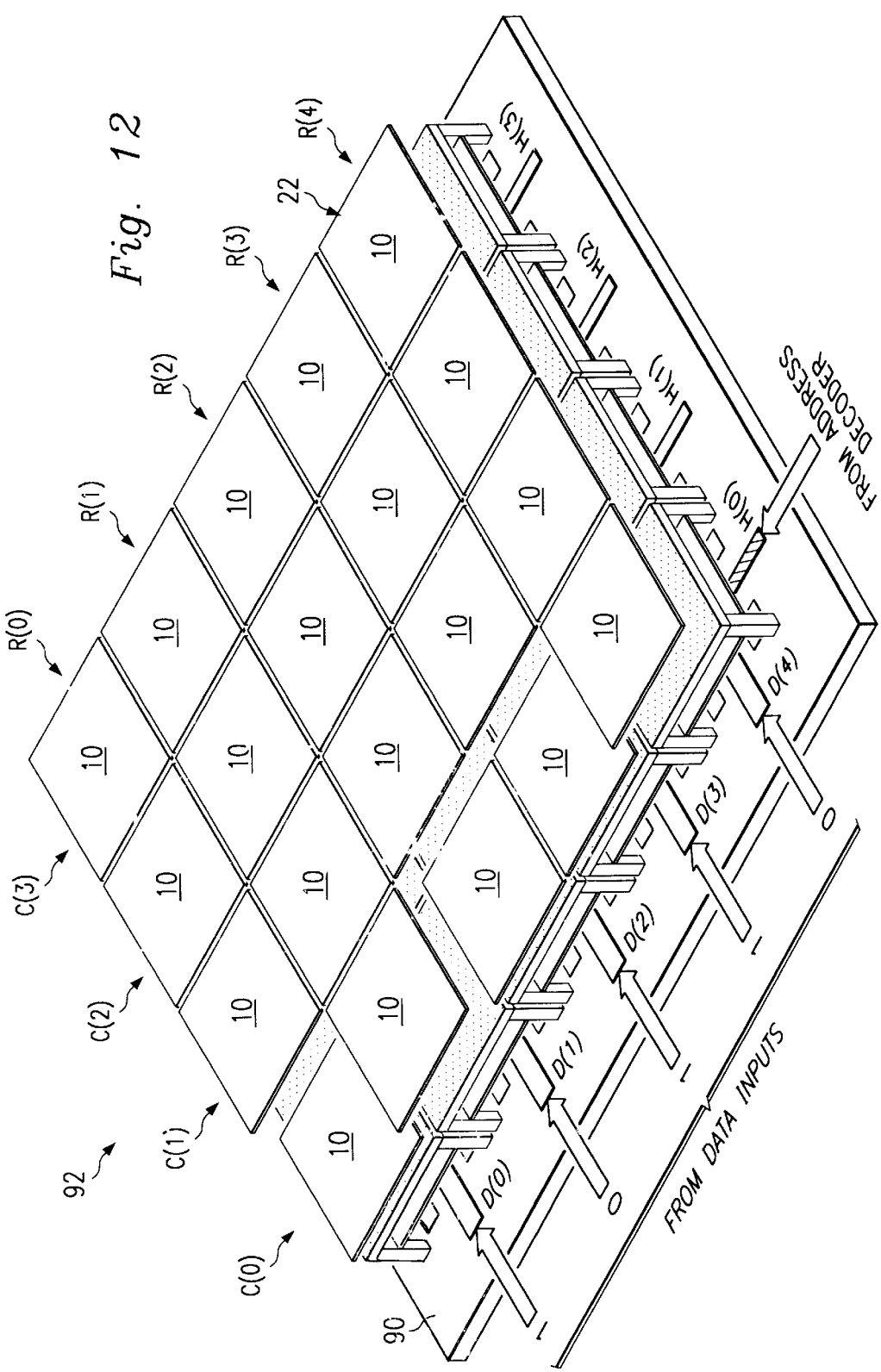

Referring now to FIG. 12, a plurality of light modulation elements can be configured into an array on a single monolithic substrate 90 to produce a micro-mirror light modulation device 92. Any of the above-mentioned light modulation elements can be used, in any combination. However, for the sake of example, 20 light modulation elements 10 are arranged in an array of five rows R(0), R(1), R(2), R(3), R(4), and four columns C(0), C(1), C(2), C(3). Conventional SRAM, DRAM, and DMD data and addressing schemes can be utilized to implement these larger arrays, as would be evident to those of ordinary skill in the art. For example, separate column and row address may be multiplexed, as is used in many DRAM architectures. Also, a clock or latch signal can be utilized to synchronize operation.

In the present example, the light modulation elements 10 of the light modulation device 92 are configured as discussed in Table 3, above. Specifically, the first and third electrodes 14, 26 for each light modulation element 10 are electrically connected to form a hold electrode. In addition, all of the data electrodes 16 for light modulation elements on a common row are electrically connected. The data electrodes for rows R(0)–R(4) are connected to data lines D(0)–D(4), respectively. The data lines D(0 . . . 4) are further connected to data inputs of the device 92, with any intermediate circuitry (e.g., registers or buffers) as necessary. Likewise, all of the hold electrodes 14, 26 for light modulation elements on a common column are electrically connected. The hold electrodes for columns C(0)–C(3) are connected to hold lines H(0)–H(3), respectively. The hold lines H(0 . . . 3) are further connected to an address decoder of the device 92, which may be further connected to address inputs and additional circuitry, as necessary.

FIGS. 12–16 illustrate a sequence of operations for individually manipulating each light modulation element 10 of the light modulation device 92. It is understood that if the light modulation device 92 is constructed with the elements 80 discussed in FIG. 9, the operation will be essentially the same as discussed below. If the light modulation device 92 is constructed with the elements 60 discussed in FIG. 4, additional and/or modified signals will need to be provided, as discussed above with reference to Table 4.

In FIG. 12, the hold line H(0) is not asserted (set equal to 0, in the present embodiment) and a data value of:

$D(0 \ldots 4) = 10110$ is provided to the device 92. The hold line H(0) is then asserted (set equal to 1). As a result, the state for the light modulation elements 10 of column C(0) are as in Table 7 below. The voltage levels of the remaining hold lines H(1 . . . 3) are a "don't care" in the present example, and may be of different values according to different implementations.

TABLE 7

| Row | Column | State |
|---|---|---|
| R(0) | C(0) | lower |
| R(1) | C(0) | free |
| R(2) | C(0) | lower |
| R(3) | C(0) | lower |
| R(4) | C(0) | free |
| R(0 . . . 4) | C(1 . . . 3) | don't care |

Figure 13:
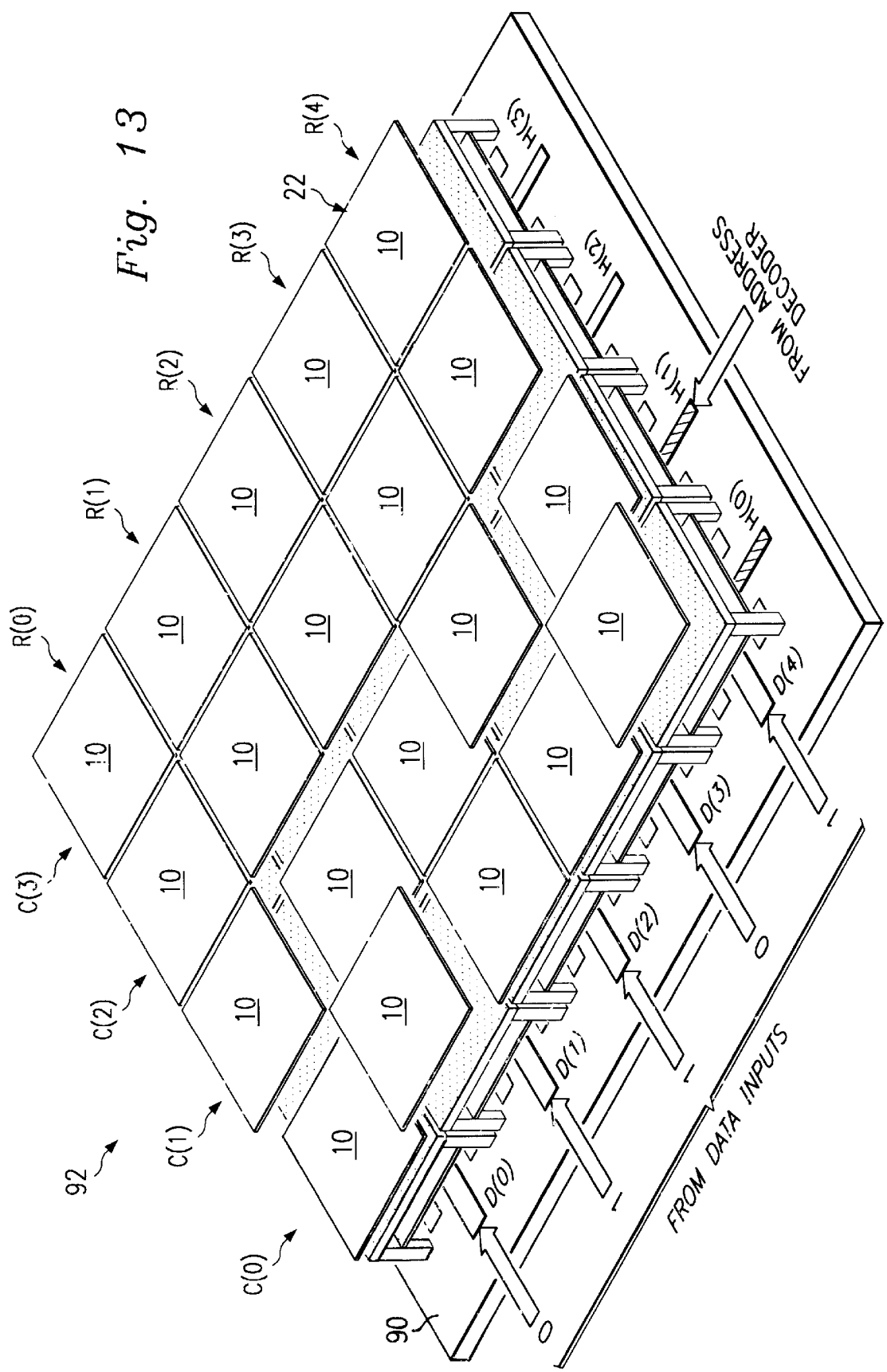

Next, in FIG. 13, the hold line H(1) is not asserted (the hold line H(0) remains asserted) and a data value of:

$D(0 \ldots 4) = 01101$ is provided to the device 92. The hold line H(1) is then asserted (the hold line H(0) remains asserted). As a result, the state for the light modulation elements 10 of column C(0 . . . 1) are as in Table 8, below.

TABLE 8

| Row | Column | State |
|---|---|---|
| R(0) | C(0) | lower |
| R(1) | C(0) | free |
| R(2) | C(0) | lower |
| R(3) | C(0) | lower |
| R(4) | C(0) | free |
| R(0) | C(1) | free |
| R(1) | C(1) | lower |
| R(2) | C(1) | lower |
| R(3) | C(1) | free |
| R(4) | C(1) | lower |
| R(0 . . . 4) | C(2 . . . 3) | don't care |

Figure 14:
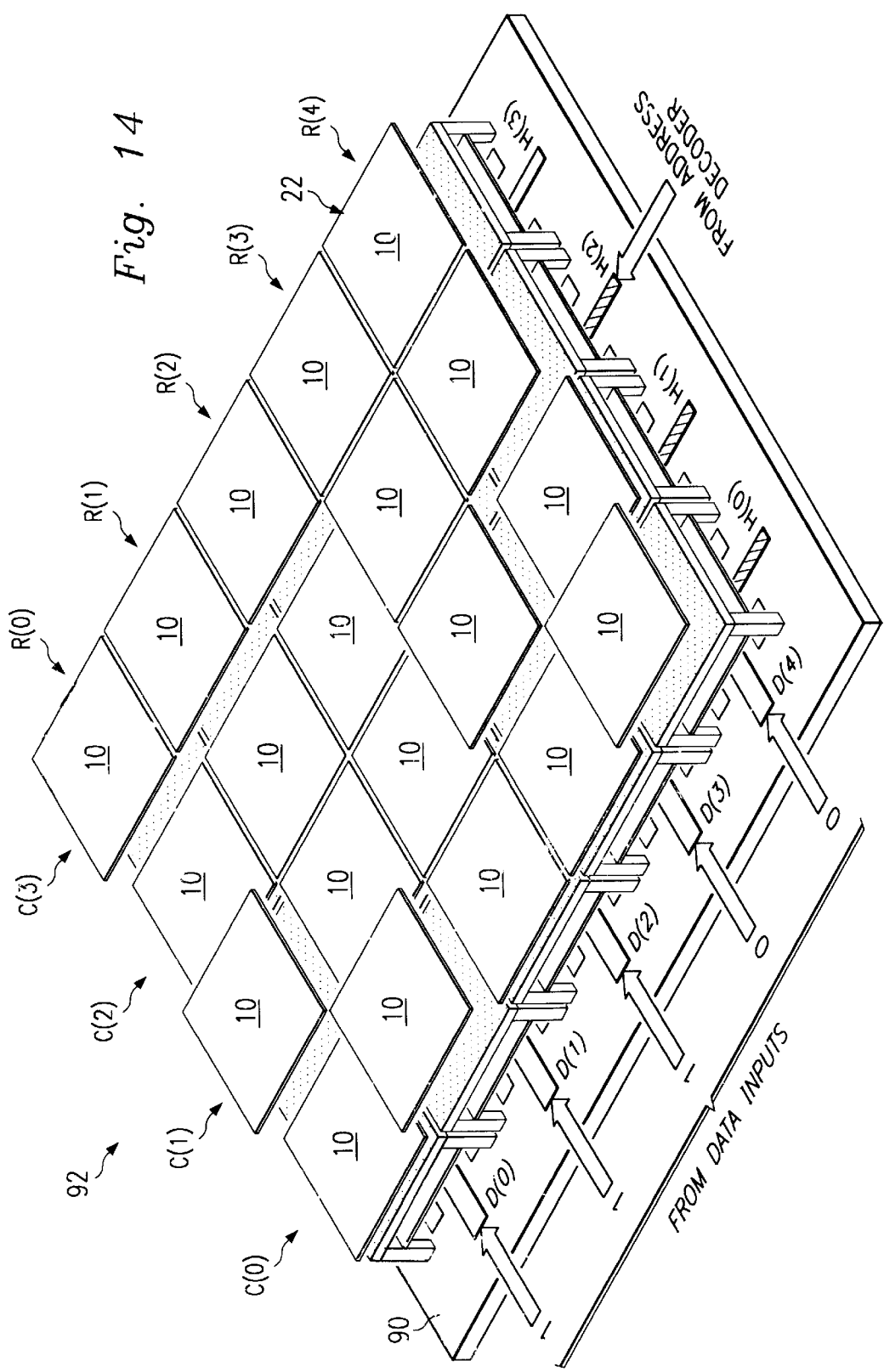

Next, in FIG. 14, the hold line H(2) is not asserted (the hold lines H(0 . . . 1) remain asserted) and a data value of:

$D(0 \ldots 4) = 11100$ is provided to the device 92. The hold line H(2) is then asserted (the hold lines H(0 . . . 1) remain asserted). As a result, the state for the light modulation elements 10 of column C(0 . . . 2) are as in Table 9, below.

TABLE 9

| Row | Column | State |
|---|---|---|
| R(0) | C(0) | lower |
| R(1) | C(0) | free |
| R(2) | C(0) | lower |
| R(3) | C(0) | lower |
| R(4) | C(0) | free |
| R(0) | C(1) | free |
| R(1) | C(1) | lower |
| R(2) | C(1) | lower |
| R(3) | C(1) | free |
| R(4) | C(1) | lower |
| R(0) | C(2) | lower |
| R(1) | C(2) | lower |
| R(2) | C(2) | lower |
| R(3) | C(2) | free |
| R(4) | C(2) | free |
| R(0 . . . 4) | C(3) | don't care |

Figure 15:
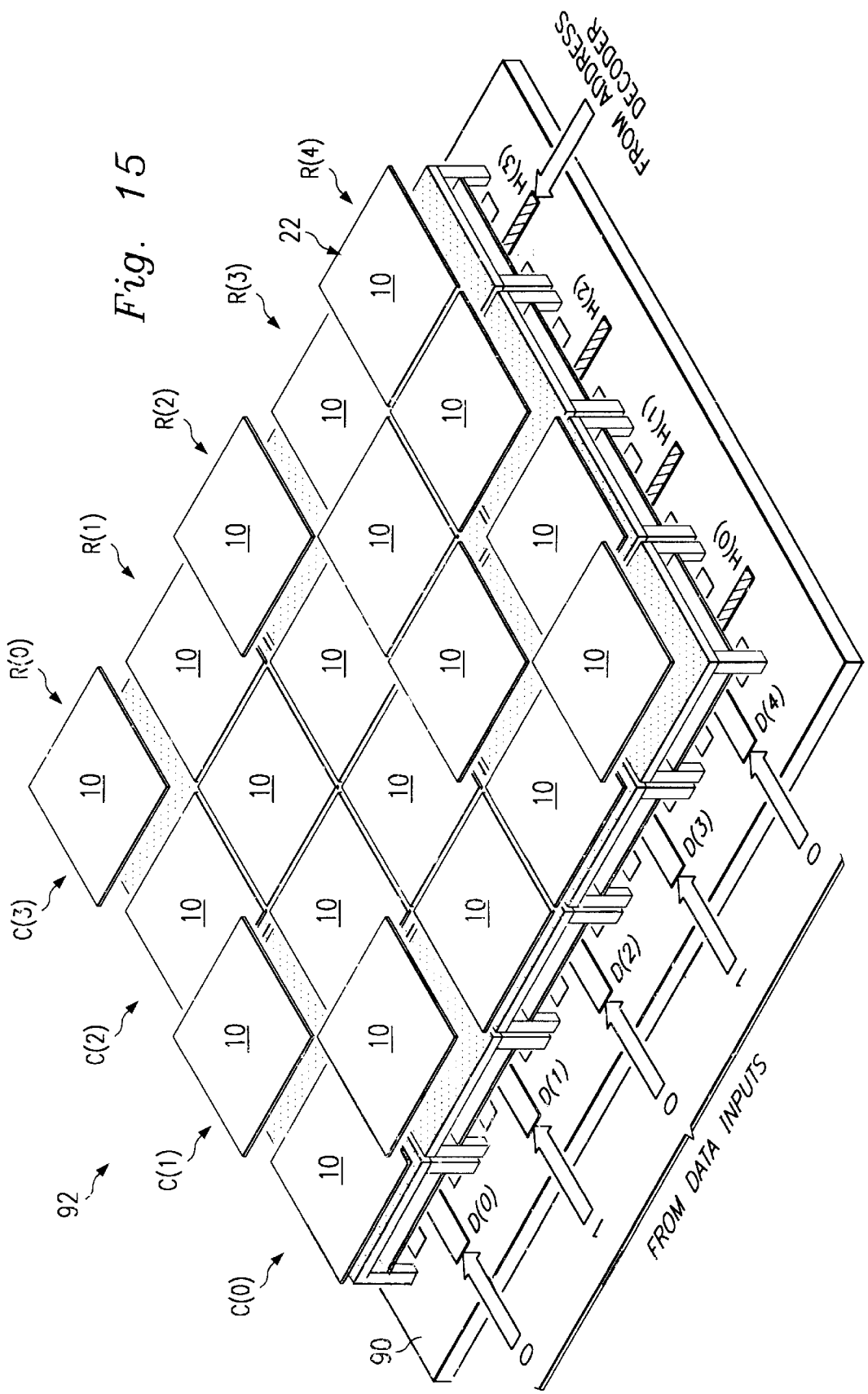

Next, in FIG. 15, the hold line H(3) is not asserted (the hold lines H(0 . . . 2) remain asserted) and a data value of:

$D(0 \ldots 4) = 01010$ is provided to the device 92. The hold line H(3) is then asserted (the hold lines H(0 . . . 2) remain asserted). As a result, the state for all the light modulation elements 10 of device 92 is provided in Table 10, below.

TABLE 10

| Row | Column | State |
| --- | --- | --- |
| R(0) | C(0) | lower |
| R(1) | C(0) | free |
| R(2) | C(0) | lower |
| R(3) | C(0) | lower |
| R(4) | C(0) | free |
| R(0) | C(1) | free |
| R(1) | C(1) | lower |
| R(2) | C(1) | lower |
| R(3) | C(1) | free |
| R(4) | C(1) | lower |
| R(0) | C(2) | lower |
| R(1) | C(2) | lower |
| R(2) | C(2) | lower |
| R(3) | C(2) | free |
| R(4) | C(2) | free |
| R(0) | C(2) | free |
| R(1) | C(2) | lower |
| R(2) | C(2) | free |
| R(3) | C(2) | lower |
| R(4) | C(2) | free |

Next, in FIG. 16, the hold line H(0) is not asserted (the hold lines H(1 . . . 3) remain asserted) and a data value of:

$$D(0 \ldots 4)=01001$$

is provided to the device 92. The hold line H(0) is then asserted (the hold lines H(1 . . . 3) remain asserted). As a result, the state for all the light modulation elements 10 of device 92 is provided in Table 11, below.

TABLE 11

| Row | Column | State |
| --- | --- | --- |
| R(0) | C(0) | free |
| R(1) | C(0) | lower |
| R(2) | C(0) | free |
| R(3) | C(0) | free |
| R(4) | C(0) | lower |
| R(0) | C(1) | free |
| R(1) | C(1) | lower |
| R(2) | C(1) | lower |
| R(3) | C(1) | free |
| R(4) | C(1) | lower |
| R(0) | C(2) | lower |
| R(1) | C(2) | lower |
| R(2) | C(2) | lower |
| R(3) | C(2) | free |
| R(4) | C(2) | free |
| R(0) | C(2) | free |
| R(1) | C(2) | lower |
| R(2) | C(2) | free |
| R(3) | C(2) | lower |
| R(4) | C(2) | free |

Therefore, the light modulation device 92 can easily address and store data in each element 10 without the use of any additional memory. Also, it is understood that different light modulation devices can be constructed, such as those that utilize the operation of the light element 10 discussed in Tables 1 and 2, above.

Light Phase Modulation Applications

The light modulation elements 10, 60, 80 and the light modulation device 92 can be used in many different applications. The elements work well for high light intensity applications as well as short wavelength applications, such as is discussed in U.S. Pat. No. 5,986,795, which is hereby incorporated by reference. For example, the light modulation device 92 works for soft x-ray applications as well as extreme ultra-violet (or "EUV") lithography with wavelengths of 100 nm or less. In these applications, the mirror 22 may be constructed with a multilayer reflective coating, including but not limited to alternate coatings of molybdenum and silicon, such as is discussed in U.S. Pat. No. 6,110,607, which is hereby incorporated by reference.

The light modulation elements 10, 60, 80 and the light modulation device 92 can also operate as optical communication devices. For example, individual light beams can be manipulated for dense wavelength division multiplexing ("DWDM"). Also, these elements and devices can be used for optical add/drop modules ("OADM"). Further, these elements and devices can be used for digital color displays and the like.

Referring now to FIG. 17, the light modulation device 92 can be used as part of a projector system 100. The projector system 100 also includes a light source 102, a beam-splitter 104, a mirror 106, and a lens system 108 for projecting an image onto a surface 110. The image from the projector system 100 is defined by a plurality of pixels, corresponding to the number of light modulation elements 10 on the light modulation device 92 (or multiples thereof).

The light source 102 may produce either coherent or non-coherent light. Certain applications can benefit by using a cheaper non-coherent light source. In the present example, the light source 102 produces light of a wavelength $\lambda$. Furthermore, each mirror 22 of the device 92 can move a distance of $\lambda/4$ between the free state and the lower state. The lens system 108 is illustrated as a single lens, but it is understood that various combinations may be employed, to meet various design choices.

The beamsplitter 104 includes a reflective surface 112 positioned between two transparent prisms 114, 116. In the present embodiment, the reflective surface 112 is a 50/50 splitter, in that half of the light intensity is allowed to pass directly through the reflective surface, while the other half reflects off the reflective surface. In some embodiments, the reflective surface may be a dichroic mirror, having different reflecting and/or passing characteristics responsive to the wavelength of incident light. Also in the present embodiment, the mirror 106 can reflect 100% of incident light. It is understood, however, that different applications may utilize different mirrors, beamsplitters, or other similar items.

In one embodiment, the beamsplitter 104 is also positioned, with the light modulation device 92 and the mirror 106, so that a perpendicular distance from the mirror 106 to a point on the reflective surface 112 is equal to a perpendicular distance from a mirror 22 (in the free state) of a corresponding light modulation element 10 to the same point. This perpendicular distance is determined when the corresponding light modulation element is in the free state. It is understood, that in other embodiments, the perpendicular distance may be determined when the light modulation element is in a different state. In these other embodiments, the logic discussed below will need to be altered, accordingly. It is further understood that in additional embodiments (e.g., laser applications), the distances for the mirror 22 and the mirror 106 to the reflective surface may be different.

To describe the operation of the projecting system 100, several light beams from the light source 102 can be traced. Consider a beam 120 being projected towards the beam splitter 104. When the beam 120 reaches the reflective surface 112, two separate beams 120.1, 120.2 (each 50% the intensity of beam 120) are produced. The beam 120.1 reflects off of the reflective surface 112 and onto the mirror 22 a of light modulation element 10a. In this example, the light modulation element 10a is in the free state. The beam 120.1 then reflects back towards the reflective surface 112. Simultaneously, the beam 120.2 passes through the reflective surface and onto the mirror 106. The beam 120.2 then reflects back towards the reflective surface 112.

In the present example, the overall distance that beam 120.1 travels is exactly equal to the overall distance that beam 120.2 travels. Therefore, when the beams 120.1, 120.2 meet again at the reflective surface 112, they constructively add to produce an output beam 120.3 with a significant amplitude (referred to as "ON") and directly in phase with the light beam 120.1. The light beam 120.3 then passes through the lens system 108 and projects a pixel onto a point P1 of the surface 110.

Consider now a beam 122 being projected towards the beam splitter 104. When the beam 122 reaches the reflective surface 112, two separate beams 122.1, 122.2 (each 50% the intensity of beam 122) are produced. The beam 122.1 reflects off of the reflective surface 112 and onto the mirror 22b of light modulation element 10b. In this example, the light modulation element 10 a is in the lower state. The beam 122.1 then reflects back towards the reflective surface 112. Simultaneously, the beam 122.2 passes through the reflective surface and onto the mirror 106. The beam 122.2 then reflects back towards the reflective surface 112.

In the present example, the overall distance that beam 122.1 travels is exactly half a wavelength ($\lambda/4+\lambda/4$) more than the overall distance that beam 122.2 travels. Therefore, when the beams 122.1, 122.2 meet again at the reflective surface 112, they interfere destructively to produce an output beam 122.3 with almost no amplitude (referred to as "OFF"). Accordingly, no pixel is projected at a point P2 identified by the output beam 122.3.

Referring now to FIG. 18, two light modulation devices 92a, 92b can be used as part of another projector system 150. The projector system 150 is similar to the projector system 100 of FIG. 17, with identical components number consistently. It is noted, however, that the projector system 150 includes the second light modulation device 92b where the mirror 106 of the previous system 100 was located.

The projector system 150 includes the additional ability to selectively alter the phase of the light from the light source 102. To provide a further example, the beamsplitter 104 is now positioned with the light modulation devices 92a, 92b, so that a perpendicular distance from a point on the reflective surface 112 to corresponding light modulation elements of the light modulation devices is a multiple of $\lambda/2$, when that light modulation element is in the lower state (this example is opposite to the one of FIG. 17).

Consider now a beam 152 being projected towards the beam splitter 104. When the beam 152 reaches the reflective surface 112, two separate beams 152.1, 152.2 (each 50% the intensity of beam 152) are produced. The beam 152.1 reflects off of the reflective surface 112 and onto the mirror 22c of light modulation element 10c (of light modulation device 92a). The beam 152.1 then reflects back towards the reflective surface 112. Simultaneously, the beam 152.2 passes through the reflective surface and onto the mirror 22d of light modulation element 10d (of light modulation device 92b). The beam 152.2 then reflects back towards the reflective surface 112.

In the present example, the light modulation elements 10c, 10d are in the same state. Therefore, the overall distance that the beam 152.1 travels is exactly the same as the overall distance that beam 152.2 travels. The beams 152.1, 152.2 then meet again at the reflective surface 112, where they constructively add to produce an output beam 152.3 that is ON. The light beam 152.3 then passes through the lens system 108 and projects a pixel onto a point P3 of the surface 110.

However, this distance traveled by the beams 152.1 and 152.2 is different for different states of the light modulation elements 10c, 10d. If both elements 10c, 10d are in the free state, both beams 152.1, 152.2 have traveled a half wavelength ($\lambda/4+\lambda/4$) less than if both light modulation elements are in the lower state. Therefore, when the beams 152.1, 152.2 meet again at the reflective surface 112, they may be exactly in phase with the incident beam 152.1, or may be 180° out of phase with the beam.

Conclusion

The elements, devices, and applications discussed above provide many advantages. For one, the light efficiency is very high (close to 100%). Also, there are no scanning components, although the systems 100, 150 can be used, for example, in a scanning lithography system.

Another advantage is that the elements, devices, and applications above can support different wavelengths from the light source 102 with slight modification. For example, the movement distance for each mirror 22 of a light modulation element 10 can be adjusted by changing the voltages on the electrodes 14, 16, 26. Also, the applications can use either coherent or non-coherent light (time/temporal coherent or spatial coherent).

Another advantage is that the light modulation device 92 does not require a separate memory. This can improve reliability (e.g., memory cells can be adversely affected by light) and can reduce manufacturing cost.

While the invention has been particularly shown and described with reference to the preferred embodiment thereof, it will be understood by those skilled in the art that various changes in form and detail may be made therein without departing form the spirit and scope of the invention.

What is claimed is:

1. An optical communication device comprising:
   a first, second, and third electrode for producing a first, second and third force, respectively;
   a support structure;
   a flexible member connected to the support structure, wherein the flexible member is responsive to a force;
   a mirror attached to the flexible member; and
   a first gap between the flexible member and the first and second electrodes so that the flexible member can move between a first and second state;
   wherein the mirror is positioned to be responsive to the state of the flexible member by moving between a first plane and a second plane, wherein the first and second planes are parallel.

2. The device of claim 1 wherein the three electrodes are positioned inside the first gap, the first, second, and third forces are all electrostatic, and the flexible member is responsive to electrostatic forces from the three electrodes.

3. The device of claim 1 further comprising:
   an actuator connected to the third electrode, the actuator for applying a mechanical force to the flexible mirror.

4. The device of claim 1 wherein the flexible member includes a central portion for securing to the mirror and at least one leg for securing to the support structure.

5. The device of claim 1 wherein the leg allows the flexible member to pop between the two states.

6. The device of claim 1 further comprising:
a stopper for limiting the movement of the flexible member.

7. A light element comprising:
a substrate;
first, second, and third electrodes positioned adjacent to the substrate and capable of producing an electrostatic force of varying intensity;
first and second support members connected to the substrate;
a flexible member spanning between the first and second support members and extending over and above the three electrodes and capable of moving between a first and second state; and
a mirror connected to and extending above the flexible member, the mirror operable to move perpendicularly relative to the substrate in response to the movement of the flexible member.

8. The element of claim 7 wherein the flexible member includes a central portion responsive to electromagnetic forces, and first and second legs for connecting the central portion to the first and second support members, respectively.

9. The element of claim 8 wherein the first and second legs are non-linear springs capable of operating in a hysteresis manner.

10. The element of claim 8 wherein at least a portion of each of the three electrodes is located under a central portion of the flexible member, and a surface area for each of the three electrode portions is relatively equal.

11. The element of claim 9 wherein the three electrodes are positioned relative to the central portion of the flexible member so that when two of the electrodes are producing an electrostatic force, the central portion will move from the first state to the second state response to an electrostatic force produced by the third electrode.

12. A light element comprising:
a substrate;
first, second, connected to the substrate;
a flexible member;
a structure connected to the substrate for supporting the flexible member to extend over and above the first and second electrodes, so that a gap is formed between the flexible member and the first and second electrodes thereby allowing the flexible member to move between a first and second state;
an actuator adjacent to the flexible member;
a third electrode adjacent to the actuator;
a mirror extending above the flexible member; and
a connector for connecting the mirror to the flexible member so that the mirror stays parallel with the substrate and a distance between the substrate and the mirror is controlled by the state of the flexible member;
wherein the first and second electrodes are situated to hold the flexible member in a prior state responsive to a hold voltage applied thereto, and
wherein the third electrode is situated to activate the actuator, which thereby selectively moves the flexible member between the first and second states.

13. The element of claim 12 wherein the flexible member is constructed of a material responsive to an electromagnetic force, and the first and second electrodes hold the flexible member utilizing electromagnetic force.

14. The element of claim 12 wherein the actuator is a piezoelectric micro-actuator.

15. The element of claim 12 wherein the actuator is a pyroelectric micro-actuator.

* * * * *